(12) United States Patent
Tschirbs et al.

(10) Patent No.: US 7,511,961 B2
(45) Date of Patent: Mar. 31, 2009

(54) BASE PLATE FOR A POWER SEMICONDUCTOR MODULE

(75) Inventors: Roman Tschirbs, Soest (DE); Reinhold Bayerer, Warstein (DE)

(73) Assignee: Infineon Technologies AG, Munich (DE)

( * ) Notice: Subject to any disclaimer, the term of this patent is extended or adjusted under 35 U.S.C. 154(b) by 71 days.

(21) Appl. No.: 11/553,248

(22) Filed: Oct. 26, 2006

(65) Prior Publication Data
US 2008/0101032 A1 May 1, 2008

(51) Int. Cl.
*H05K 7/20* (2006.01)
(52) U.S. Cl. .................. 361/704; 361/707; 257/706
(58) Field of Classification Search .............. None
See application file for complete search history.

(56) References Cited

U.S. PATENT DOCUMENTS

| | | | | |
|---|---|---|---|---|
| 5,528,075 A | * | 6/1996 | Burns | 257/666 |
| 6,122,170 A | * | 9/2000 | Hirose et al. | 361/704 |
| 6,175,084 B1 | * | 1/2001 | Saitoh et al. | 174/252 |
| 6,252,179 B1 | * | 6/2001 | Lauffer et al. | 174/263 |
| 6,310,775 B1 | * | 10/2001 | Nagatomo et al. | 361/707 |
| 6,369,332 B1 | * | 4/2002 | Saitoh et al. | 174/260 |
| 6,392,143 B1 | * | 5/2002 | Koshio | 174/528 |
| 6,529,380 B1 | * | 3/2003 | Kono | 361/708 |
| 7,019,975 B2 | * | 3/2006 | Nagatomo et al. | 361/704 |
| 7,180,745 B2 | * | 2/2007 | Mandel et al. | 361/719 |
| 7,256,353 B2 | * | 8/2007 | Osanai et al. | 174/252 |
| 7,289,329 B2 | * | 10/2007 | Chen et al. | 361/707 |
| 7,339,788 B2 | * | 3/2008 | Olesen et al. | 361/699 |
| 7,355,853 B2 | * | 4/2008 | Emoto et al. | 361/704 |
| 2005/0286234 A1 | * | 12/2005 | Campbell et al. | 361/719 |
| 2007/0268671 A1 | * | 11/2007 | Brandenburg et al. | 361/704 |

* cited by examiner

*Primary Examiner*—Boris L Chervinsky
(74) *Attorney, Agent, or Firm*—Coats & Bennett, P.L.L.C.

(57) ABSTRACT

A power semiconductor module is to be pressed to a heat sink with a first surface of a first side of a base plate. To reduce the heat transfer resistance between the base plate and the heat sink, the first surface has, at least in a state, when the power semiconductor module is not pressed against the heat sink, at least one inflection point.

17 Claims, 10 Drawing Sheets

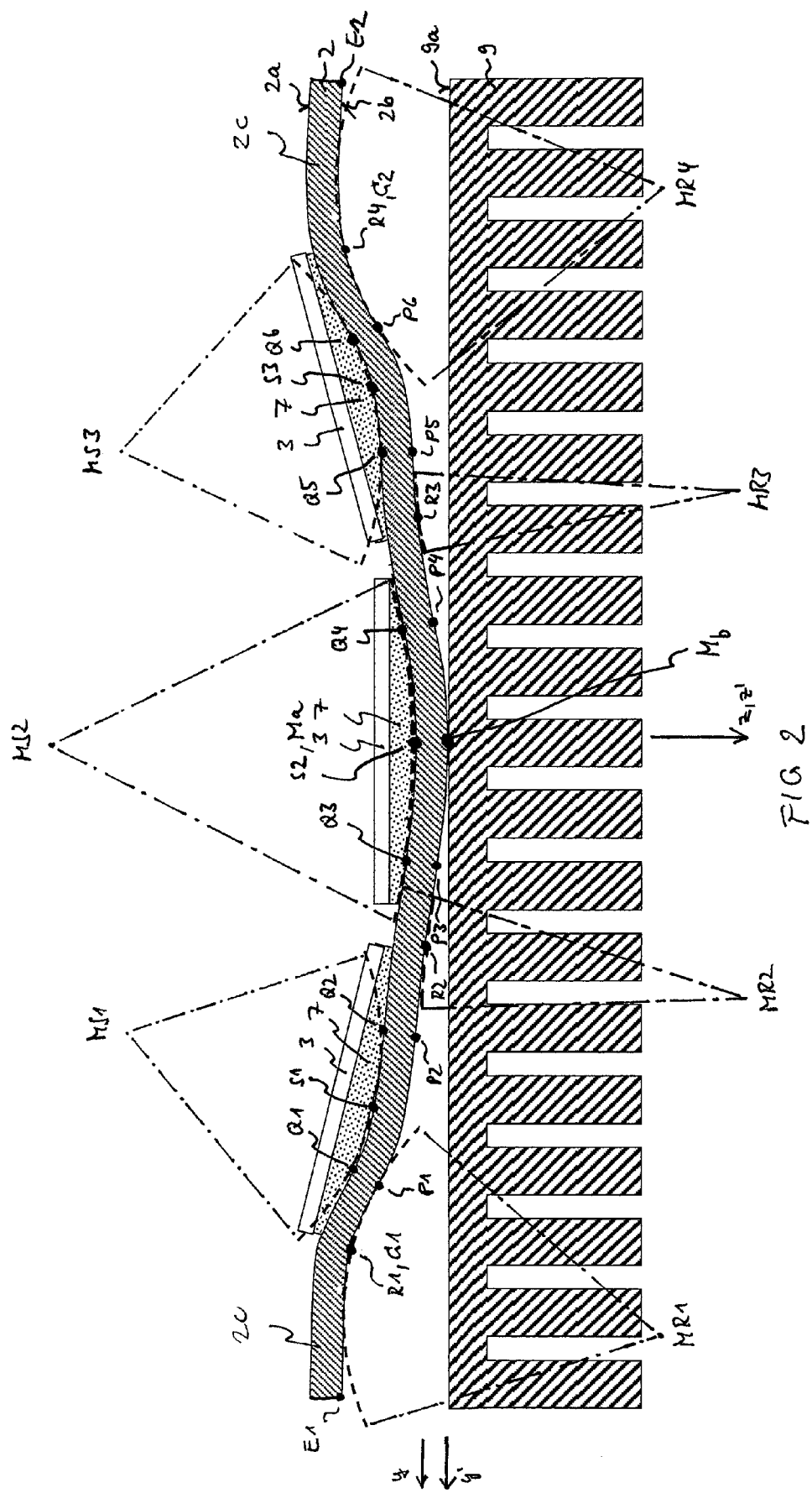

BASE PLATE FOR A POWER SEMICONDUCTOR MODULE

TECHNICAL FIELD

The invention relates to power semiconductor modules having a base plate, to arrangements comprising such a power semiconductor module being pressed against a heat sink, and to a base plate. Further the invention relates to method for designing a power semiconductor module having a base plate.

BACKGROUND

Power semiconductor modules comprise a base plate, on which at least one circuit carrier, permanently joined to the base plate, is arranged. At least on circuit carrier is populated with one, two or more power semiconductor chips. Usually, the power semiconductor chips have power electronic circuits, such as, bridge rectifiers, DC links, IGBT inverters, half bridges, full bridges, matrix converters, drivers, control units, sensor units, half bridge inverters, AC/DC converters, DC/AC converters, DC/DC converters, bidirectional hybrid switches, high-voltage supplies, and further components, for example.

During operation, the power semiconductor module is pressed against a heat sink via the base plate. Depending on the calculated power loss occurring in the power semiconductor module, thermomechanical stress occurs due to different heat expansion coefficients of different components of the module. In consequence, deflection of the base plate appears. This can lead to a local increase of the distance and to an associated unacceptable increase of the heat transfer resistance between the base plate and the heat sink as well as to an exceeding of predefined maximum temperatures of the semiconductor chips and further components of the power semiconductor module. There is a need to provide a power semiconductor module comprising a base plate, which, when mounted with its base plate to a heat sink, has an improved heat transfer resistance between the base plate and the heat sink.

SUMMARY

In an embodiment a base plate for a power semiconductor module may comprise a first side having an uneven shaped first surface with at least one inflection point.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numbers designate corresponding parts. In the drawings:

FIG. 1b is a top view of a quarter model of the fitted base plate of FIG. 1a;

FIG. 2 is a cross-sectional view of a vertical section through a base plate according to FIG. 1a along an axis y, from which it can be seen that the base plate has two sides located opposite one another and a plurality of inflection points;

DETAILED DESCRIPTION

As stated above in an embodiment a base plate for a power semiconductor module may comprise a first side having an uneven shaped first surface with at least one inflection point.

In another embodiment, a power semiconductor module may comprise a base plate having a first side and a second side opposite the first side, the first side having a first surface and the second side having a second surface, the power semiconductor module to be pressed against a contact surface of a heat sink with the first surface, wherein the first surface, at least if the power semiconductor module is not pressed against the contact surface, is uneven shaped and has at least one inflection point.

In yet another embodiment, an arrangement may comprise a power semiconductor module, the power semiconductor module having a base plate and a heat sink having a contact surface, the power semiconductor module with the first surface being pressed against the contact surface, wherein the first surface has an inflection point at least when the power semiconductor module is not pressed against the contact surface.

In yet another embodiment, a method for designing a power semiconductor module may comprise a base plate having a first side, the power semiconductor module to be pressed against a contact surface of a heat sink with a first surface of the first side, the method comprising the steps of (a) selecting a base plate having an initial geometry as a first component and at least one further component of the power semiconductor module, which is to be designed; (b) selecting a heat sink as well as a pressing technique, with which pressing technique the power semiconductor module is to be pressed with the first surface against a contact surface of the heat sink; (c) predefining an operating temperature for at least one of the selected components of the power semiconductor module; (d) estimating a power loss during operation of the power semiconductor module; (e) predefining a maximum heat transfer resistance between the base plate and the heat sink, at which the predefined operating temperature of the respective component is not exceeded at the estimated power loss; (f) calculating the heat transfer resistance, which occurs with the power semiconductor module assembled from the selected base plate and the selected further components; pressed against the heat sink by dint of the selected pressing technique; and operated with the estimated power loss; (g) changing the current geometry of the base plate and repeating steps (f) and (g), provided that the first surface does not comprise an inflection point or the simulated heat transfer resistance is greater than the predefined, maximum heat transfer resistance of step (e).

Figure 1A:
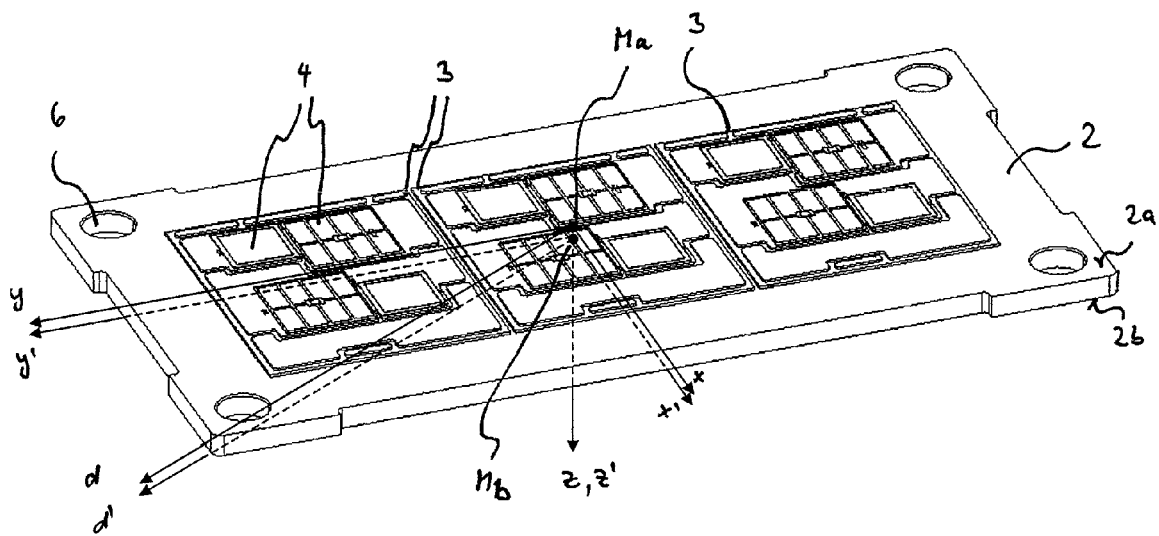
FIG. 1a is a perspective view of a base plate of a power semiconductor module, on which circuit carriers fitted with semiconductor chips.
Figure 1B:
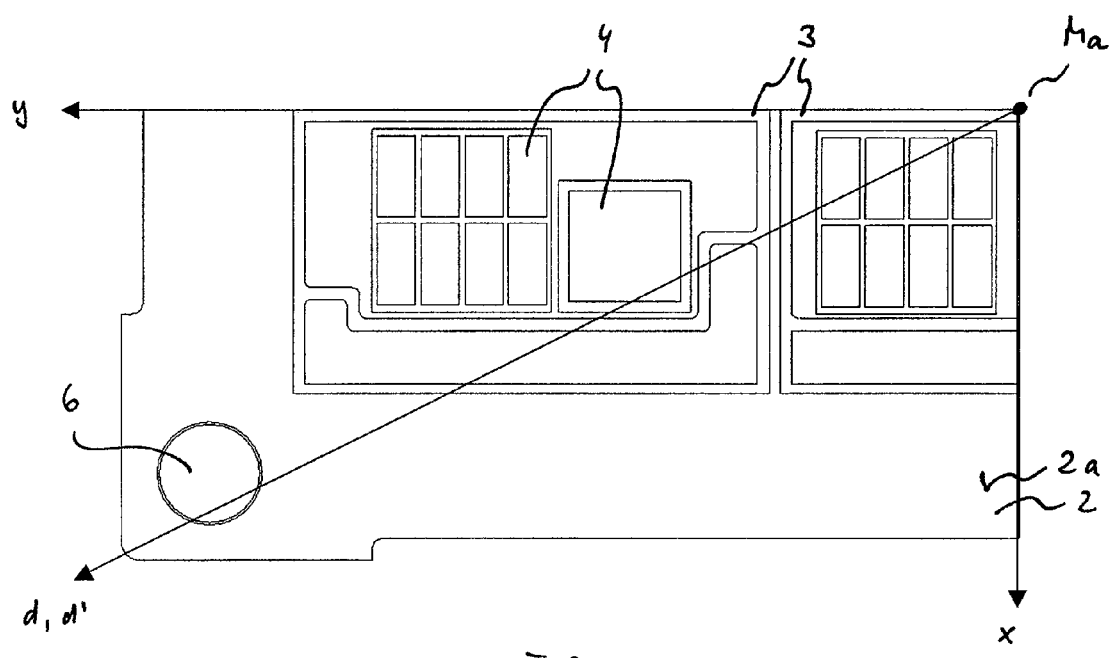

FIG. 1a shows an embodiment of a base plate 2 of a power semiconductor module in perspective view. In one embodiment, three circuit carriers 3 arranged in series are mounted on a surface 2a of an upper side of the base plate 2. Each of the circuit carriers 3 can be fitted with semiconductor chips 4. The surface 2a of the upper side has a center $M_a$, the surface 2b of the lower side a center $M_b$. FIG. 1a shows a first coordinate system having its origin in the center $M_a$ of the surface 2a of the upper side and having axes x, y, z, being pairwise perpendicular to one another. In the x-y-plane a further axis d extends from the origin and center $M_a$ to a corner of the base plate 2. Furthermore, a second coordinate system having its origin in the center $M_b$ of surface 2b of the lower side and having axes x', y', z', being pairwise perpendicular to one another. In the x'-y'-plane a further axis d' extends from the origin and center $M_b$ to a corner of the base plate 2. In one embodiment, the surface 2b of the lower side of the base plate 2 has inflection points, which are not visible in this view. FIG. 1b shows a quarter model of the base plate 2 according to FIG. 1a in top view. Referring to both FIG. 1a and FIG. 1b, in one embodiment, the base plate 2 is symmetrical with reference to a 180° C rotation about an axis of rotation being perpendicular to an x'-y'-plane extending through the center $M_a$ of the surface of the upper side.

FIG. 2 shows a vertical section through an embodiment of a base plate 2 of a novel power semiconductor module loosely bearing on a flat and even contact surface 9a of a heat sink 9 in the center $M_b$ of the surface 2b of its lower side. Due to presentability reasons the scale in the directions z, z' is larger than the scale in the directions y, y'.

In one embodiment, the base plate 2 has a lower side having an uneven shaped first surface 2b with at least one inflection point and an upper side located opposite the lower side and having a second surface 2a. In one embodiment, three circuit carriers 3 ("substrates") are soldered onto the surface 2a of the upper side by means of a respective solder layer 7. In one embodiment, in the cross-sectional view at hand, the surface 2b of the lower side of the base plate 2 has six inflection points P1, P2, P3, P4, P5, and P6. In one embodiment, the surface 2a of the upper side has six inflection points Q1, Q2, Q3, Q4, Q5, and Q6.

In one embodiment, in the cross-sectional view of FIG. 2, the surface 2b of the lower side further has four locations R1, R2, R3, and R4, at which the radius of curvature of the surface 2b of the lower side has local minima and the centers of curvature MR1, MR2, MR3, and MR4 thereof are located below the base plate 2. Contrary thereto, the surface 2a of the upper side has three locations S1, S2, and S3, at which the radius of curvature of the surface 2a of the upper side has local minima and the centers of curvature MS1, MS2, and MS3 thereof are located above the base plate 2.

In one embodiment, circuit carriers 3 are each arranged above each of the points S1, S2, and S3, i.e., the points S1, S2, and S3 are each located between one of the circuit carriers 3 and the lower side of the base plate 2. In some embodiment of a novel power semiconductor module, none, one or more, or all of the circuit carriers 3 of the module may be arranged above such a concave location S1, S2, S3 of the surface 2a of the upper side.

During operation of the power semiconductor module, the surface 2b of the lower side of the base plate 2 is pressed against a contact surface of a heat sink by a predefined pressing technique, and components of the module have operating temperatures. In some embodiment, the shape of the surface 2b of the lower side of the base plate 2 as well as the positions of the inflection points P1, P2, P3, P4, P5, P6, Q1, Q2, Q3, Q4, Q5, and Q6, and the positions of the points of minimal curvature R1, R2, R3, R4, S1, S2, and S3 are chosen in such a manner that a predefined, maximum heat transfer resistance between the base plate and the heat sink 9 is not exceeded during operation.

In one embodiment, the force for pressing the base plate 2 against the heat sink 9 is effected by the predefined pressing technique, e.g. by means of screws 16, which are guided through persistent openings 6 (see FIGS. 1a and 1b) of the base plate 2 and screwed with the heat sink 9. In some embodiments, alternatively or additionally, the heat sink 9 and the base plate 2 may also be pressed against one another by means of rivets, clamps or springs, for example.

In some embodiments, the predefined operating temperature, may be, for example, a maximally acceptable temperature of a semiconductor chip arranged on one of the circuit carriers 3, of a soldering or adhesive joint between a circuit carrier 3 and a semiconductor chip, of a soldering or adhesive joint between the circuit carrier 3 and the base plate 2, of the circuit carrier 3, of a case of the module or of the base plate 2 itself.

In an embodiment, the base plate 2 may be preformed in such a manner that, during operation of the power semiconductor module with a predefined power loss in the semiconductor chips, the surface 2b of the lower side of the base plate 2 deviates only very slightly from the ideal case of a flat and even surface, i.e. that the heat transfer resistance between the base plate 2 and the heat sink 9 becomes minimal.

In an embodiment, the geometry of the base plate 2 may be chosen in such a manner that the median distance between the surface 2b of the lower side of the base plate 2 and of the contact surface 9a of the heat sink 9 is greater in response to smaller power losses in the power semiconductor module, than in response to higher power losses. Through this, higher power losses lead to a decreased heat transfer resistance between the base plate 2 and the heat sink 9 and thus to an increased cooling capability.

In the embodiment of FIG. 2, the surface 2b of the lower side of the base plate has a counterformation in the diagonal direction d in an edge region $2c$. The counterformation consists of a smaller slope of the surface $2b$ of the lower side in the edge region $2c$ between locations C1, C2 and respective edges E1, E2 of the lower side.

Figure 3:
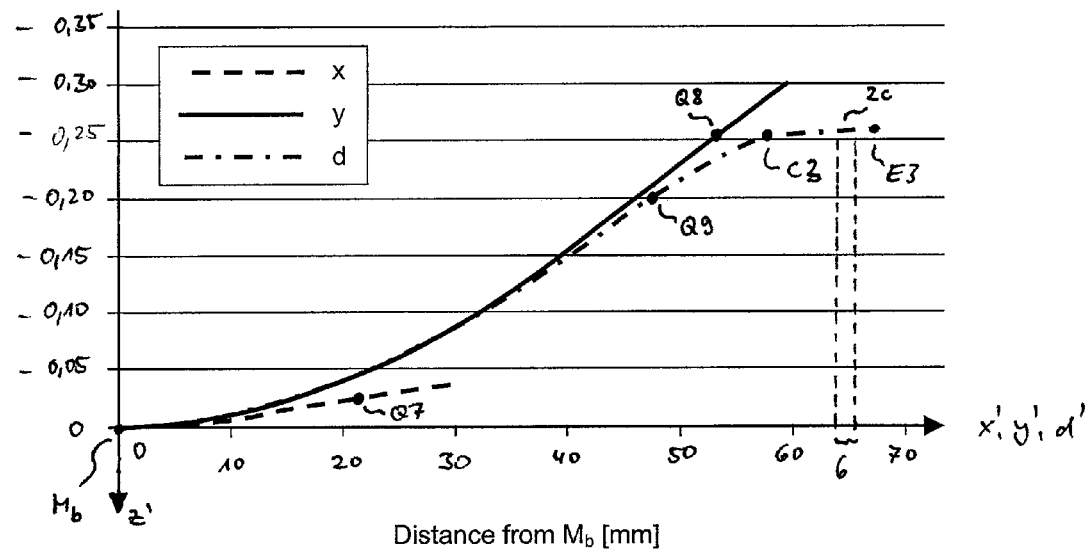
FIG. 3 depicts the profile of the surface of the lower side of a base plate in three different directions.

FIG. 3 shows an embodiment of a possible vertical profile of the surface $2b$ of the lower side of a quarter model of a base plate 2 according to FIG. $1b$, starting from the center $M_b$ of the surface $2b$ of the lower side of the base plate 2 in two directions x' and y' being perpendicular to one another as well as in a diagonal direction d' in the x'-y'-plane, each in dependence on the distance to the center $M_b$ of the surface $2b$ of the lower side. The height specifications also refer to the x'-y'-plane.

In an embodiment, the surface $2b$ of lower side of the entire base plate 2 has two inflection points Q7, Q8 or Q9, respectively, in each of the directions x', y', and d' (as FIG. 3 as FIG. 3 refers to a quarter model of a base plate, in each of the directions x', y', and d' only one of these inflection points can be seen). In an embodiment, the surface $2b$ of lower side of the base plate is curved in the region of its center $M_b$ in the direction of a heat sink to be mounted. In an embodiment, in the diagonal direction d' the surface $2b$ of the lower side of the base plate 2 comprises a counterformation in a region $2c$ of the base plate 2, defined by a smaller slope between a location C3 and an edge E3 of the surface $2b$ of the lower side.

Figure 4:
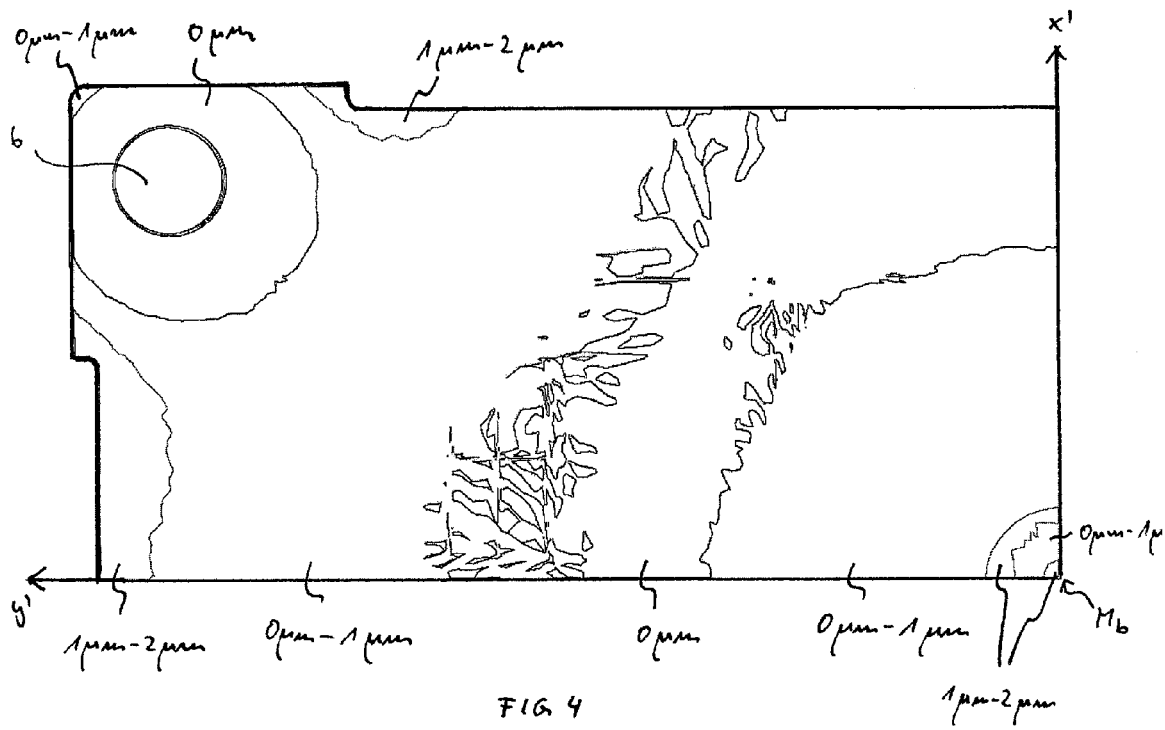
FIG. 4 is a diagram, which represents the distance between the base plate of a power semiconductor module and a heat sink joined therewith, at a temperature of the base plate of 90° C., the power semiconductor module being optimized to a temperature of the base plate of 90° C.

FIG. 4 shows a diagram, which represents the distance between the surface of the lower side of the base plate fitted with three circuit carriers of a power semiconductor module according to an embodiment and the contact surface of a heat sink joined therewith, at a temperature of the base plate of 90° C. The geometry of the base plate was optimized for this temperature. The distance between the surface of the lower side and the heat sink is not greater than 2 µm at any location.

Figure 5:
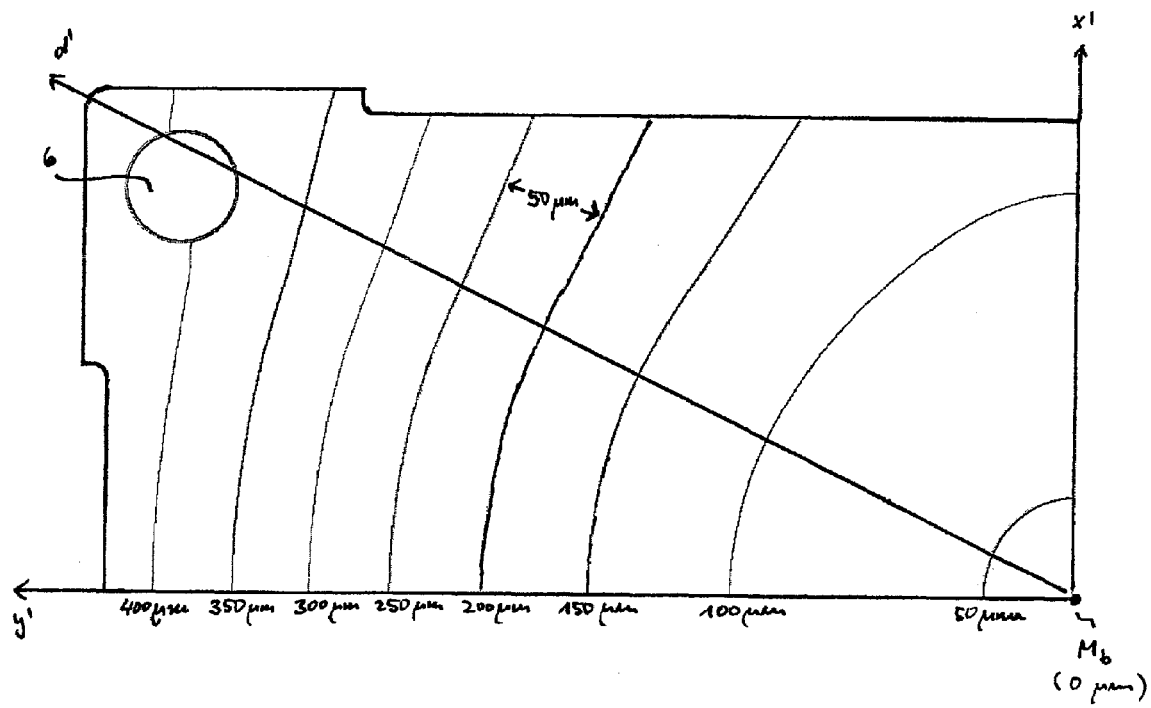
FIG. 5 depicts the curve progression of the contour lines of the surface of the lower side of the base plate of a power semiconductor module and fitted with circuit carriers, but without a heat sink attached to the base plate, at a temperature of the base plate of 200° C.

By means of level curves 11, FIG. 5 shows the profile of the surface of the lower side of a base plate fitted with circuit carriers, but not being mounted to a heat sink. In an embodiment, adjacent level curves 11 in the z'-direction have a vertical distance of 50 µm. In an embodiment, the temperature of the solder between the circuit carriers and the base plate is 200° C., which corresponds to the solidification temperature of the solder. In an embodiment, in this state, the surface of the lower side of the base plate has an comparatively extreme convex form. In an embodiment, the superelevation of the edge of the base plate with respect to its center $M_b$ is more than 400 µm in the y'-direction as well as in the d'-direction; it is more than 100 µm in the x'-direction.

Figure 6:
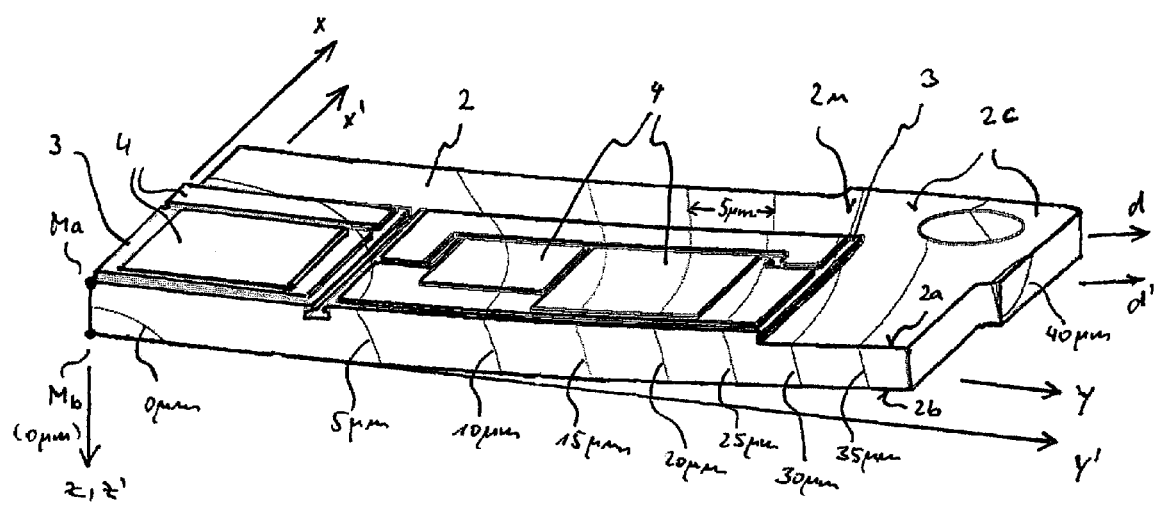
FIG. 6 is a perspective view of the fitted base plate onto FIG. 5 with view onto the upper side, from which a change of the points of the base plate can be seen as compared to an originally flat and even, non-curved base plate.

FIG. 6 is a perspective view to the upper side of a base plate 2, again at a temperature of the solder arranged between the circuit carriers 3 and the base plate 2, of 200° C. In an embodiment, the surface $2a$ of the upper side of the base plate 2 is fitted with circuit carriers 3. The diagram shows the change of the elevation in z'-direction of the points of the base plate as compared to base plate with flat and even surfaces $2a$, $2b$ of the upper and lower sides, respectively, by means of faces having the same change of elevation. In an embodiment, the difference of the changes of elevation corresponding to adjacent faces is 5 µm.

The performing allows for the local thermomechanical stresses and deflections during operation and shows an area $2c$ having a counterformation of the surface $2b$ of the lower side in an edge region around the mounting opening 6. In the area $2c$, the absolute value of the gradient of the surface $2b$ of the lower side is smaller than the absolute value of the gradient of the surface $2b$ of the lower side in an area $2g$ next to the area $2c$, the area $2g$ being located between the area $2c$ and the center $M_b$. The counterformation corresponds to the counterformation already described in FIG. 3. Attached to a flat and even contact surface of a heat sink the surface $2b$ of the lower side of the base plate 2 is almost flat and even during operation at a predefined temperature of the base plate 2.

Figure 7:
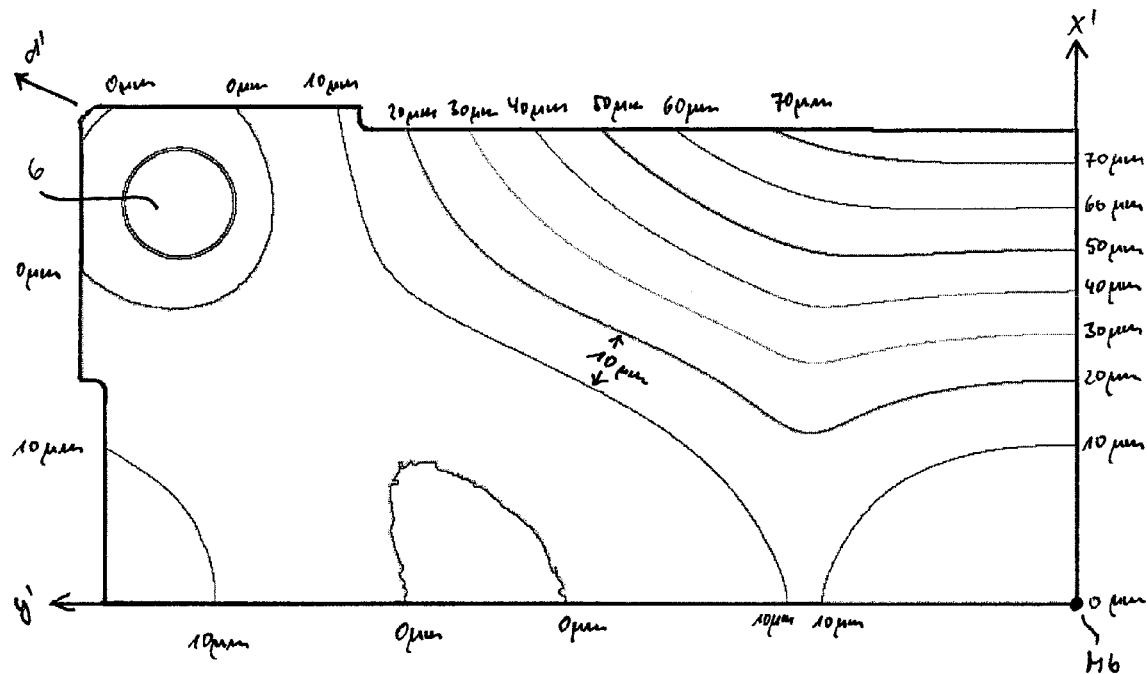
FIG. 7 is a diagram representing the distance between the contact surface of a heat sink and the surface of the lower side of the base plate, optimized for an operating temperature of 90° C., of the power semiconductor module onto FIGS. 5 and 6 at room temperature.

FIG. 7 is a diagram representing, in a location-dependent manner, the distance between a flat and even contact surface of a heat sink and the lower side of a base plate optimized at an operating temperature of 90° C. with the base plate being at room temperature for a power semiconductor module fitted with a base plate according to FIGS. 5 and 6. Apart from the temperature the power semiconductor module has been optimized for, the distance with up to 78 µm is clearly greater than the distance of 2 µm described with reference to FIG. 4 at a temperature of 90° C.

At a predefined operating temperature of 90° C., the heat transfer resistance between the base plate and the heat sink is thus considerably less than at room temperature. Through this, an optimal operation is ensured at the predefined operating temperature. Instead of such an optimization of the heat transfer resistance between the base plate and the heat sink to a base plate temperature of 90° C., an optimization can also be effected for any other predefined operating temperature, e.g., at base plate temperatures of 40° C. to 45° C. in response to the operation of the power semiconductor module at ambient temperature, at 60° C. to 85° C. for industrial uses, to greater than 90° C., for example 110° C. to 130° C., for uses in the automobile field, in which the ambient temperature of the power semiconductor module is determined by engine temperatures.

Another measure for reducing the heat transfer resistance between a base plate 2 and a contact surface of a heat sink is illustrated with reference to FIG. 8. In an embodiment, the shown section of a base plate 2 has a mounting opening 6, around which an annular elevation $2d$ is arranged on the surface $2b$ of the lower side. In an embodiment, the elevation $2d$ is embodied in an exemplary manner as a cylinder ring, which gradually protrudes beyond the surface $2b$ of the lower side. In an embodiment, instead of a closed cylinder ring, provision can also be made for differently shaped elevations.

Figure 8:
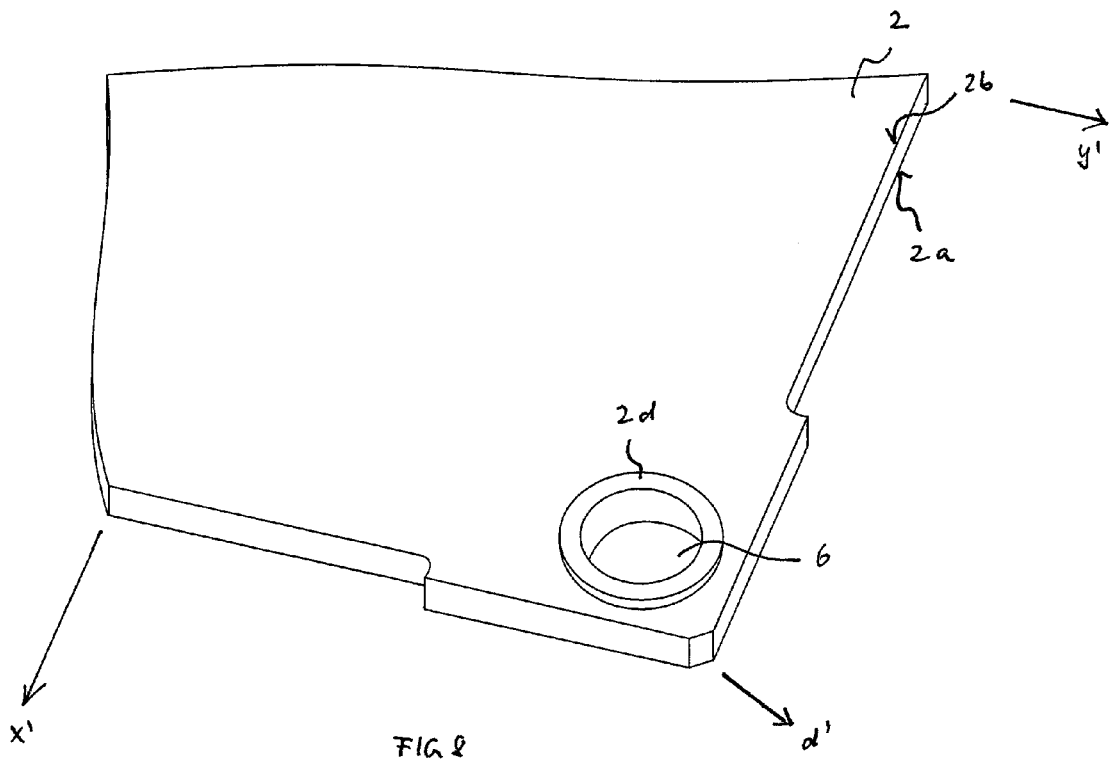
FIG. 8 is a perspective view of a base plate with an annular elevation arranged around a mounting opening.

FIG. 9 shows a model for the behavior of a base plate 2 (FIG. $9b$) according to FIG. 8 compared with the behavior of a conventional, flat and even base plate (FIG. $9a$) in response to locally being pressed against the contact surface $9a$ of a heat sink 9 by means of a force F, e.g. generated by means of a screw. In both cases, the surface area region of the heat sink 9 facing to the base plate is represented by means of springs.

In response to locally pressing the base plate 2 against the contact surface $9a$ of the heat sink 9, the base plate 2 is compressed in the region of the pressing location, and setting processes, which are caused by creeping in the materials, occur there. Accordingly, an intensive contact between the base plate 2 and the heat sink 9 is created at the pressing location, while the base plate 2 lifts from the contact surface $9a$ of the heat sink 9 in the regions spaced apart from the pressing location.

Contrary thereto, the elevation $2d$ as shown in FIG. $9b$ generates a predefined rate action for the setting mechanism of the material partners in the region of the pressing location, whereby the tendency for lifting the base plate 2 from the contact surface $9a$ of the heat sink 9 decreases in the regions, which are distant from the pressing location.

Furthermore, in response to pressing the base plate 2 against the contact surface $9a$ of the heat sink 9, the elevation $2d$ leads to an increased pretensioning of the heat sink 9 in the region of the pressing location, whereby a greater pressing force, which is required for permanent screw joints, may be selected.

Figure 9A:
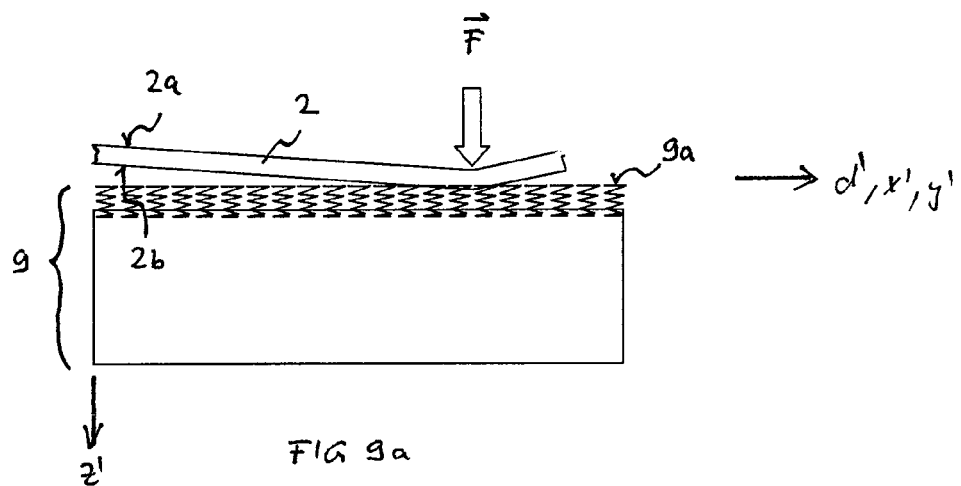
FIG. 9 shows the behavior of a conventional base plate compared with a conventional base plate in a cross-sectional view.
Figure 10:
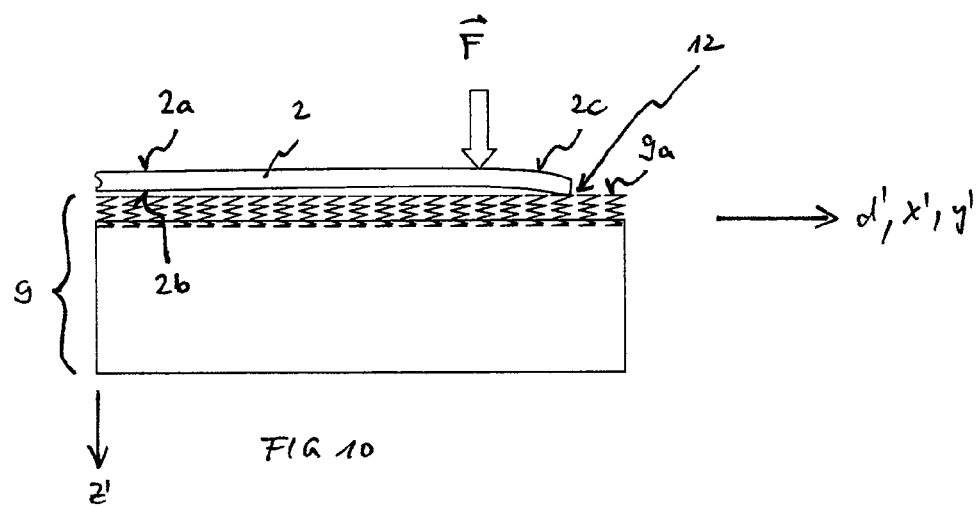
FIG. 10 is a section of a base plate to be mounted on a heat sink, the base plate having a counterformation at its edge region, in a cross-sectional view.

FIG. 10 is a cross-sectional view of an edge section of a base plate 2 during pressing against a heat sink 9. The surface 2b of the lower side of the base plate 2 has a counterformation in an edge region 2c as described in FIGS. 2, 3 and 6. The pressing force F, e.g. generated by means of a screw, acts on the base plate 2, laterally offset from a support location 12 of the base plate 2 on the contact surface 9a. This creates a pretension of the base plate, which counteracts the pressure force F. If, for example, the pressure force F is generated by means of a screw joint, the long-term stability of the screw joint improves due to this pretension. At the same time, the tendency of the base plate 2 to lift from the contact surface 9a of the heat sink 9 in response to an exposure to the pressing force F, as explained in FIG. 9a, is reduced.

A mounting opening 6 with an elevation 2d of the surface 2b of the lower side may be located anywhere on the base plate 2. Further, a counterformation as explained in FIGS. 2, 3 and 6 may be provided in any direction, especially in one or more of the directions x', y' and d'.

Figure 9B:
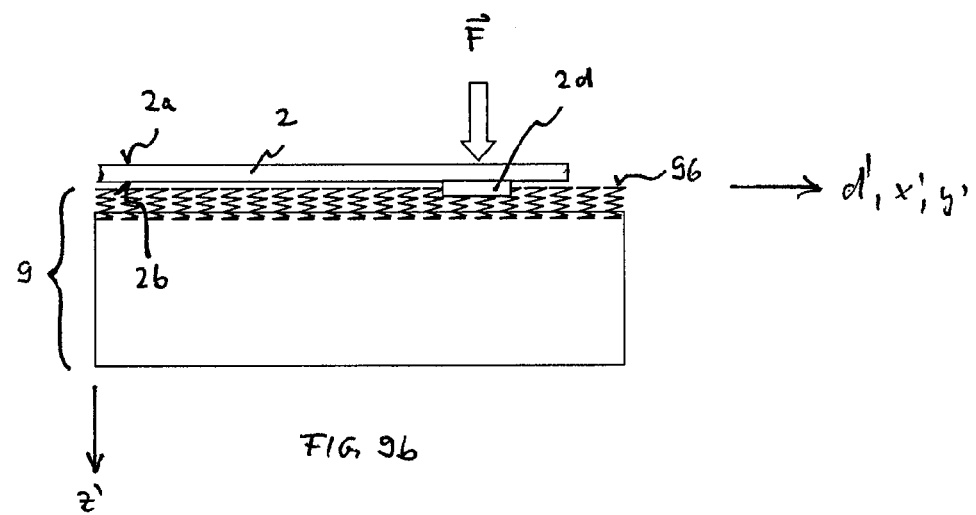

In the present cross-sectional views each of the base plates of FIGS. 9b and 10 has at least one inflection point on its lower side 2b in an area left of the shown sections.

Figure 11:
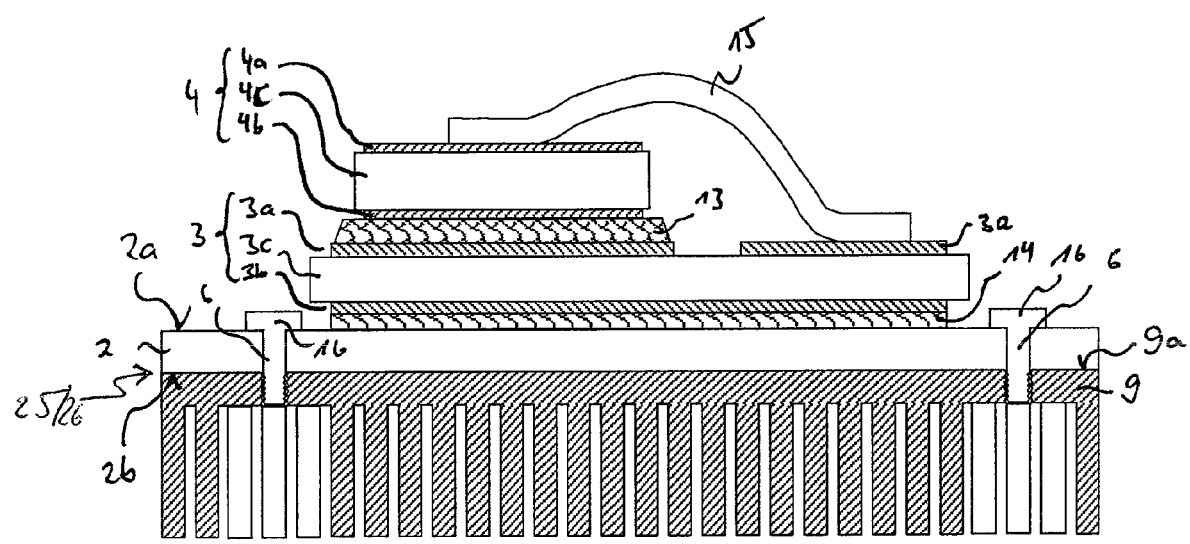
FIG. 11 is a cross-sectional view through an arrangement comprising a power semiconductor module being pressed against a contact surface of a heat sink.

FIG. 11 is a cross-sectional view through an embodiment comprising a power semiconductor module and a heat sink 9. In an embodiment, the power semiconductor module comprises a base plate which is fitted with a circuit carrier 3. With the surface 2b of the lower side of the base plate 2 the power semiconductor module is pressed against a contact surface 9a of the heat sink 9. In this view, the pre-curvature as well as inflection points of the surface 2b of the lower side of the base plate 2 is not illustrated for presentability reasons.

In an embodiment, the surface 2b of the lower side of the base plate 2 may have at least one inflection point in a state, when the power semiconductor module is not pressed against the heat sink 9. In an embodiment, when pressing the module against the heat sink 9, the inflection point may disappear.

Further, in an embodiment, the base plate 2 and the power semiconductor module may have one or more features of the base plates and power semiconductor modules as described above. Such features may be freely combined with one another as long as they are not mutually exclusive.

In an embodiment, the base plate 2 may be highly heat-conducting and may comprise or consist of metals, such as aluminum and/or copper. In an embodiment, a circuit carrier 3, which is fitted with a semiconductor chip 4, is arranged on the surface 2a of the upper side of the base plate 2. In an embodiment, a circuit carrier 3 can also be fitted with more than one semiconductor chip 4. In an embodiment, likewise, a plurality of circuit carriers 3, instead of such fitted circuit carriers 3, can also be arranged on the surface 2a of the upper side of the base plate 2.

In an embodiment, the circuit carrier 3 comprises a dielectric sub-carrier 3c, which, at least at its upper side, is provided with a structured metallization 3a and, optionally, with a metallization 3b at its lower side. In particular, in an embodiment, the circuit carrier 3 may be a DCB substrate (DCB=direct copper bonding), a DAB substrate (DAB=direct aluminum bonding), a AMB substrate (AMB=active metal brazed) or a MMA substrate (MMA=metal matrix composite). In an embodiment, a ceramic, such as, e.g., aluminum oxide, is suitable to be used as a dielectric sub-carrier 3c. In an embodiment, the metallization 3a on the upper side of the circuit carrier 3 is structured and can be separated into control current contacts and load current contacts. In an embodiment, with its metallization 3b on its lower side, the fitted circuit carrier 3 is joined to the surface 2a of the upper side of the base plate 2 by means of a connection layer 14. In an embodiment, suitable materials for the metallizations 3a and/or 3b are, e.g., copper or aluminum or alloys with at least one of these materials.

In an embodiment, the semiconductor chip 4 arranged on the metallization 3a on the upper side of the circuit carrier 3 comprises a semiconductor body 4c, e.g. a silicon substrate, for example, which is provided with metallizations 4a, 4b on opposite sides. In an embodiment, with its metallization 4b on its lower side, the semiconductor chip 4 is joined to a section of the structured metallization 3a of the circuit carrier 3 by means of an electroconductive connection layer 13, e.g. a solder layer or a low-temperature joint.

Furthermore, in an embodiment, the metallization 4a on the upper side of the semiconductor chip 4 is joined to a further section of the structured metallization layer 3a of the circuit carrier 3 by means of bonding wires 15. In an embodiment, alternatively to a bonding connection, metal clips, for example, may also be provided, which are connected with the first metallization 3a by means of a soldered joint or a low-temperature joint. In an embodiment, for pressing the base plate 2 against the contact surface 9a of the heat sink 9, screws 16, for example, which are guided through persistent mounting openings 6 of the base plate 2 and which are screwed with the heat sink 9, may be used.

In an embodiment, to compensate for unevenness of the surface 2b of the lower side of the base plate 2 and of the contact surface 9a of the heat sink 9, and to produce a high thermal contact between the heat sink 9 and the base plate 2, optionally, a heat conducting paste 25 or an elastic heat conducting film 26 may be provided between the heat sink 9 and the base plate 2.

Figure 12:
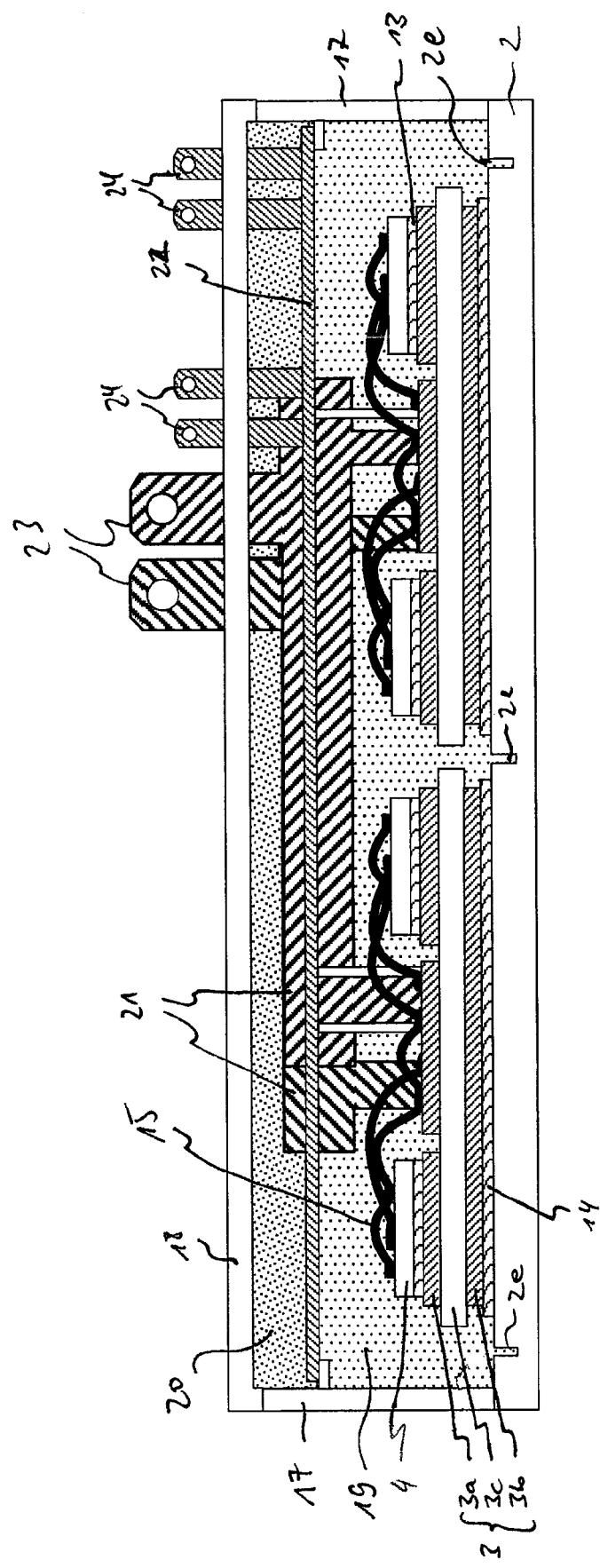
FIG. 12 is a cross-sectional view through a power semiconductor module having a bus bar.

For clarity purposes, certain components of the power semiconductor module partly have not been illustrated. FIG. 12, thus, shows a vertical section through a power semiconductor module in an exemplary manner in more detail. In an embodiment, in this cross-sectional view, two circuit carriers 3 are mounted on a base plate 2 by means of a connection layer 14. In an embodiment, the base plate 2 has notches 2e, which, starting from the surface 2a of the upper side of the base plate 2 extend into the base plate 2 and which are provided for the reduction of thermomechanical stresses in the connection layer 14. In an embodiment, the notches 2e especially can be located in areas close to edges and/or corners of a substrate 3 or of a connection layer 14.

To ensure mechanical stability, to avoid permeation of dirt and humidity, and to increase insulation stability of the power semiconductor module 1, in an embodiment, the power semiconductor module 1 comprises a housing with side walls 17 and a cover 18. The base plate 2 may form the bottom of the housing.

Furthermore, in an embodiment, the power semiconductor module is cast as well with a soft sealing compound 19 as with a hard sealing compound 20. In an embodiment, the soft sealing compound 12 extends from the surface 2a of the upper side of the base plate 2 at least beyond the upper sides of the semiconductor chips 4 or at least beyond the contact wires 15. In an embodiment, the hard sealing compound 20 is arranged above the soft sealing compound 19 on its side facing away from the base plate 2.

In an embodiment, for externally contacting, the power semiconductor module 1 comprises a bus bar 21, 22, which is electroconductively connected at least with the metallization layers 3a of the upper sides of the circuit carriers 3, e.g., by means of a soldering or contact wire connection. With such a bus bar 21, 22, it is particularly possible to electrically connect the different fitted circuit carriers 3 of the power semiconductor module 1.

In an embodiment, the bus bars 22 are connected with external control connection lugs 24, the bus bars 21 bearing the load currents are connected with external load connection lugs 23. In an embodiment, the electrical connection between the semiconductor chips 4 and the bus bars 21, 22 is effected by means of contact wires 15, either directly or indirectly via sections of the metallization layer 3a.

Figure 13:
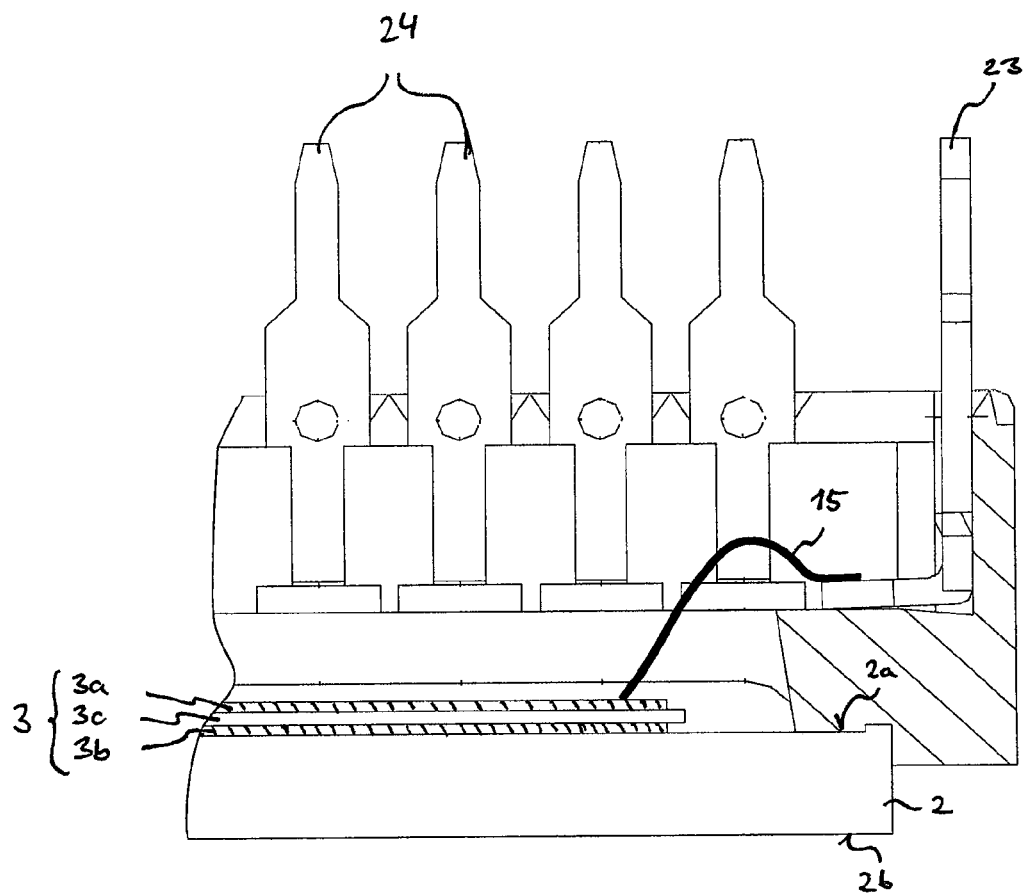
FIG. 13 is a cross-sectional view through a section of a power semiconductor module having external connecting contacts and being wired by means of bonding wires.

In some embodiments, instead of or in addition to such a bus bar 21, 22, the external connection lugs 23 and/or 24 can also be provided as separate elements, as it is illustrated in an exemplary manner in FIG. 13 by means of a vertical sectional view through a section of a novel power semiconductor.

In an embodiment, the power semiconductor module has external load connection lugs 23, as well as external control connection lugs 24, which are plugged into guide rails embodied at the inside wall of the housing and, optionally, engaged therein. In an embodiment, at their lower end, the connection lugs 23, 24 are bent over by 90° for the purpose of forming lower regions. In an embodiment, the lower regions bear on a protrusion of the housing and can thus be electrically connected with a semiconductor chip 4 or with a section of the metallization 3a of a circuit carrier by means of a bonding connection.

Figure 14:
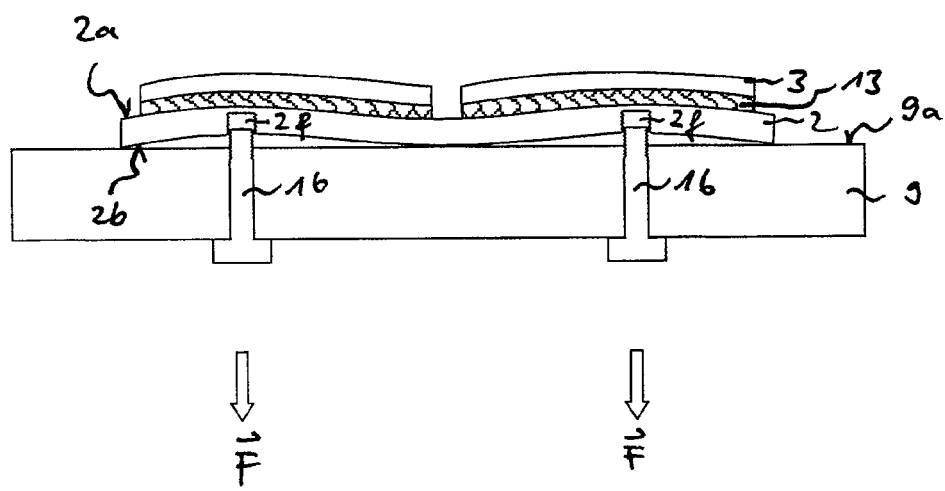
FIG. 14 is a cross-sectional view through a power semiconductor module, the base plate of which has recesses with internal threads arranged below circuit carriers for screwing the base plate with the heat sink.

The power semiconductor modules shown so far comprise screw joints with a heat sink by means of one or more mounting openings provided in the base plate. FIG. 14 shows an alternative or additional way for mounting a power semiconductor module on a heat sink 9. In an embodiment, the surface 2b of the base plate 2 is pre-formed and the surface 2b of its lower side has at least one inflection point. In an embodiment, the surface 2a of the upper side of the base plate 2 is provided with circuit carriers 3 and has, in its cross-sectional view, two recesses 2f with internal threads. In an embodiment, each of the recesses 2f extends, starting from the surface 2b of the lower side, on level with a circuit carrier 3 into the base plate 2. In an embodiment, by means of a respective screw 16, a force F can be generated, which presses the base plate 2, with the surface 2b of its lower side, against the contact surface 9a of the heat sink 9. In the instant view, the screws 16 are not yet completely tightened.

In an embodiment, before tightening the screws 16, due to the pre-forming and the at least one inflection point of the surface 2b there is no holohedral contact between the base plate 2 and the heat sink 9, i.e. in certain areas the surface 2b and the contact surface 9a are spaced apart from one another. In an embodiment, the screws 16 are arranged at places laterally being spaced apart from locations at which the base plate 2 contacts the heat sink 9.

In an embodiment, after tightening the screws 16, the base plate 2 rests against the contact surface 9a with the surface 2b of its lower side in a substantially flat and even manner. In an embodiment, the remaining median distance between the surface 2b and the contact surface 9a is very small and may become minimal, e.g., at a predefined operating temperature of the base plate during operation of the power semiconductor module. In an embodiment, the median distance between the surface 2b and the contact surface 9a after tightening the screws 16 may be, at ambient temperature and/or at a predefined operating temperature of the base plate during operation of the power semiconductor module, e.g. less than or equal to 30 μm.

Figure 15:
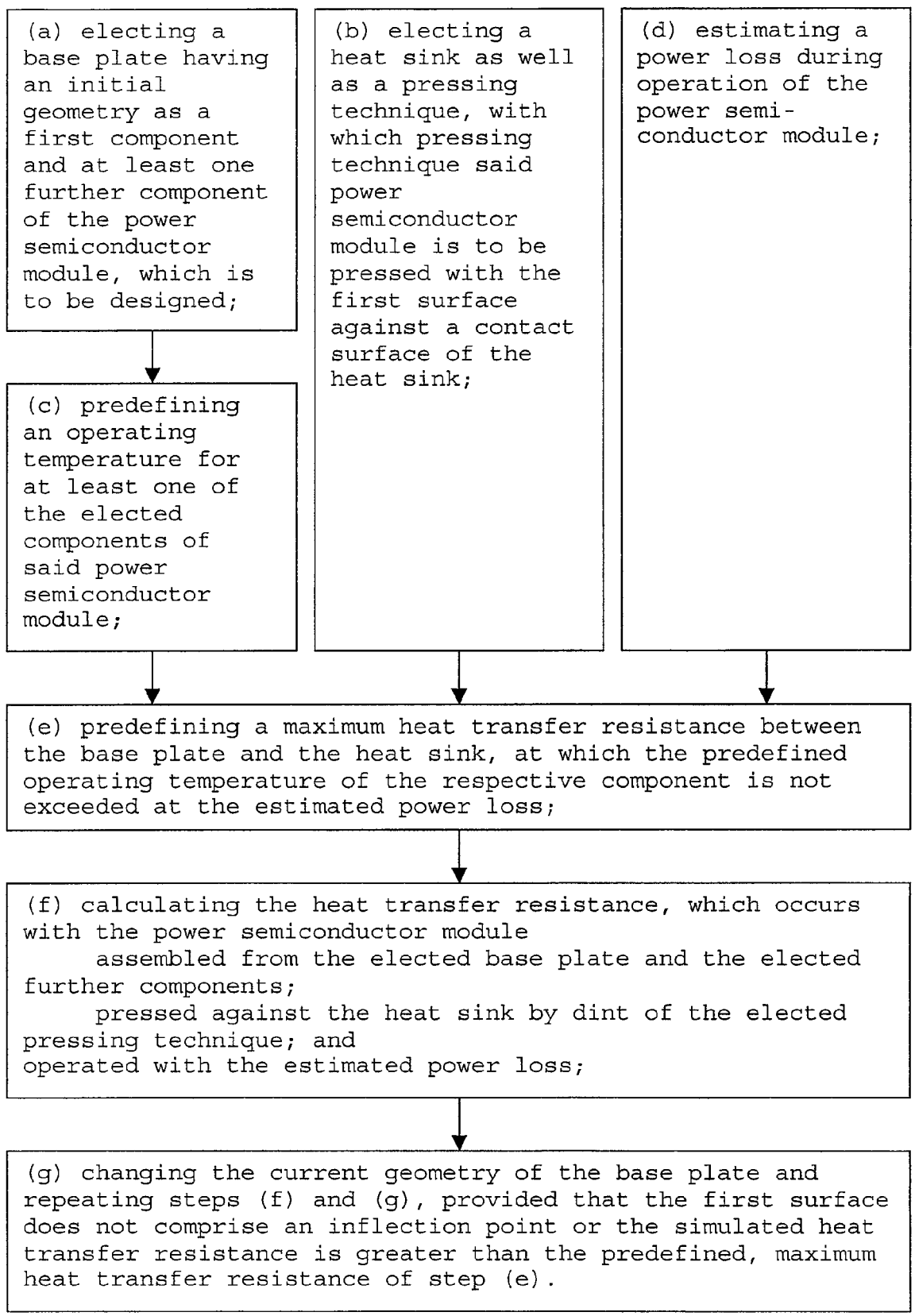
FIG. 15 is a flow chart of a method for designing a power semiconductor module comprising a base plate having a lower side with a first surface, with which the power semiconductor module is to be pressed against a contact surface of a heat sink.

A flow chart of a method for designing a power semiconductor module having a base plate with a first side to be pressed against a contact surface of a heat sink, is shown in FIG. 15.

In a step (a) a base plate as a first component, having an initial geometry, and at least one further component of the power semiconductor module to be designed are selected. For example, these further components can be one or more circuit carriers, a soldering layer or an adhesive layer between a semiconductor chip and a circuit carrier, a soldering layer or an adhesive layer between a circuit carrier and the base plate, or a heat conducting paste or heat conducting film, which is to be arranged between the heat sink and the base plate.

In a step (b), a heat sink and a pressing technique are predefined, with which pressing technique the power semiconductor module is to be pressed with the first surface of its base plate against a contact surface of the heat sink.

Furthermore, an operating temperature for at least one of the selected components of the power semiconductor module to be designed, e.g. a semiconductor chip, a circuit carrier or the base plate, is predefined in a step (c). The operating temperature may be, e.g., a maximum operating temperature of the selected component.

In a step (d) a power loss during operation of the power semiconductor module is estimated.

Based on these predefinitions and elections, in a step (e) a maximum heat transfer resistance between the base plate and the heat sink is predefined. The maximum heat transfer resistance ensures that the predefined operating temperature of the respective component is not exceeded at the estimated power loss.

In a step (f) the heat transfer resistance between the base plate and the heat sink is calculated. The calculation, e.g. carried out by use of a computer, is effected on the basis of the power semiconductor module assembled from the base plate and the further components, and pressed against a contact surface of the heat sink by dint of the selected pressing technique, as well as on the basis of the estimated power loss. The simulation of the heat transfer resistance may include the simulation of the distance between the base plate and the heat sink as a function of the location.

Provided that the first side has at least one inflection point and that the simulated heat transfer resistance between the heat sink and the base plate is greater than the predefined, maximum heat transfer resistance, in a step (g) the current geometry of the base plate is changed and the steps (f) and (g) are repeated. If the maximum heat transfer resistance is reached or undershot with a selected base plate geometry, it is ensured that the predefined operating temperature is not exceeded in response to a compliance with the underlying parameters. In this case, a power semiconductor module may be assembled from a base plate comprising a geometry according to the current geometry, and at least from components according to the at least one further component.

With this method, the order of the steps (a) to (d) may be arbitrarily chosen wherein it has merely to be taken into consideration that step (a) must be effected prior to step (c). Further, step (e) has to be effected prior to step (f), and step (f) prior to step (g).

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

What is claimed is:

1. A base plate for a power semiconductor module, comprising a first side having an uneven shaped first surface with at least one inflection point located at a predetermined position, the predetermined position of the at least one inflection point is predetermined so that a maximum heat transfer resistance between the base plate and an adjacent heat sink is not exceeded during operation of the power semiconductor module.

2. The base plate according to claim 1, further comprising a second side being located opposite to the first side and having an uneven shaped second surface with at least one inflection point located at another predetermined position.

3. The base plate according to claim 1, wherein the uneven shaped first surface has at least two inflection points located at different predetermined positions.

4. The base plate according to claim 1, comprising an opening, which extends from the first surface into the base plate, wherein the first surface has an annular elevation arranged around the opening.

5. The base plate according to claim 1, wherein, starting from the first surface, a recess with internal threads extends into the base plate.

6. The base plate according to claim 1, wherein the at least one inflection point is present before the base plate is attached to the heat sink.

7. The base plate according to claim 1, wherein the position of the at least one inflection point is predetermined as a function of at least one of an expected operating temperature of the power semiconductor module and an estimated power loss of the power semiconductor module.

8. The according to claim 1, wherein the position of the at least one inflection point is predetermined so that the first side of the base plate remains relatively flat during operation of the power semiconductor module.

9. A power semiconductor module comprising a base plate having a first side and a second side opposite the first side, the first side having a first surface and the second side having a second surface, the power semiconductor module to be pressed against a contact surface of a heat sink with the first surface, wherein the first surface, at least if the power semiconductor module is not pressed against the contact surface, is uneven shaped and has at least one inflection point located at a predetermined position.

10. The power semiconductor module according to claim 9, wherein the first surface has at least two inflection points located at different predetermined positions.

11. The power semiconductor module according to claim 9, wherein the base plate has a recess or an opening and extends on level with a circuit carrier being arranged on the second surface from the first surface into the base plate and has an internal thread.

12. The power semiconductor module according to claim 9, wherein the base plate has a persistent opening, which, starting from the first surface, extends into the base plate, whereby the first surface has an annular elevation, which is arranged around the opening.

13. An arrangement comprising a power semiconductor module, said power semiconductor module having a base plate and a heat sink having a contact surface, the power semiconductor module with a first surface being pressed against the contact surface, wherein the first surface has an inflection point located at a predetermined position at least when the power semiconductor module is not pressed against the contact surface.

14. The arrangement according to claim 13, wherein the first surface has at least two inflection points located at different predetermined positions at least when the power semiconductor module is not pressed against the contact surface.

15. The arrangement according to claim 14, wherein a median distance between the first surface of the base plate and the contact surface of the heat sink is less than or equal to 30 μm at an operating temperature of the base plate during operation of the power semiconductor module.

16. The arrangement according to claim 15, wherein the operating temperature ranges from 40° C to 45° C or from 90° C or from 60° C to 85° C or from 110° C to 130° C.

17. The power semiconductor module according to claim 13, wherein the contact surface is flat.

* * * * *